United States Patent [19]
Vishakhadatta et al.

[11] Patent Number: 6,111,712
[45] Date of Patent: Aug. 29, 2000

[54] METHOD TO IMPROVE THE JITTER OF HIGH FREQUENCY PHASE LOCKED LOOPS USED IN READ CHANNELS

[75] Inventors: G. Diwakar Vishakhadatta, Austin; Jerrell P. Hein, Driftwood, both of Tex.

[73] Assignee: Cirrus Logic, Inc., Austin, Tex.

[21] Appl. No.: 09/036,608

[22] Filed: Mar. 6, 1998

[51] Int. Cl.[7] .................................................. G11B 5/09
[52] U.S. Cl. ............................................................ 360/51
[58] Field of Search .......................... 360/51, 46; 369/59; 331/2, 50

[56] References Cited

U.S. PATENT DOCUMENTS

| | | | |
|---|---|---|---|
| 4,024,475 | 5/1977 | Bragas et al. | 325/55 |
| 4,408,349 | 10/1983 | Yukawa | 455/182 |
| 4,500,851 | 2/1985 | Sawa et al. | 331/1 |
| 4,516,084 | 5/1985 | Crowley | 331/2 |
| 4,864,437 | 9/1989 | Couse et al. | 360/75 |
| 4,979,055 | 12/1990 | Squires et al. | 360/69 |
| 5,034,703 | 7/1991 | Schumacher | 331/2 |
| 5,038,115 | 8/1991 | Myers et al. | 331/2 |
| 5,170,299 | 12/1992 | Moon | 360/77.08 |
| 5,255,136 | 10/1993 | Machado et al. | 360/77.02 |
| 5,260,842 | 11/1993 | Leake et al. | 360/51 |
| 5,297,184 | 3/1994 | Behrens et al. | 375/98 |
| 5,315,270 | 5/1994 | Leonowich | 331/1 A |
| 5,321,559 | 6/1994 | Nguyen et al. | 360/46 |
| 5,335,365 | 8/1994 | Ballantyne et al. | 455/76 |
| 5,345,342 | 9/1994 | Abbott et al. | 360/48 |
| 5,384,671 | 1/1995 | Fisher | 360/51 |
| 5,422,760 | 6/1995 | Abbott et al. | 360/46 |
| 5,424,881 | 6/1995 | Behrens et al. | 360/40 |
| 5,459,679 | 10/1995 | Ziperovich | 364/602 |
| 5,481,573 | 1/1996 | Jacobowitz et al. | 375/356 |
| 5,572,558 | 11/1996 | Beherns | 375/376 |
| 5,576,904 | 11/1996 | Behrens | 360/51 |
| 5,579,184 | 11/1996 | Nakanishi et al. | 360/51 |
| 5,638,230 | 6/1997 | Kadlec | 360/78.04 |
| 5,642,243 | 6/1997 | Bliss | 360/51 |
| 5,870,591 | 2/1999 | Sawada | 360/51 |

OTHER PUBLICATIONS

Cideciyan et al., "A PRML System for Digital Magnetic Recording," *IEEE J. on Sel. Com..*, 10, Jan. 1992.

Coker et al., "Implementation of PRML in a Rigit Disk Drive," *IBM Storage Systems Products Division*, Manuscript received Jul. 7, 1991.

Fields et al., "SA 19.1: A 200Mb/s CMOS EPRML Channel with Integrated Servo Demodulator for Magnetic Hard Disks," *IEEE Int'l Solid–State Circuits Conf*, Feb. 8, 1997.

Goodenough, "DSP Technique Nearly Doubles Disk Capacity," *Electronic Design*, 53–57, Feb. 4, 1993.

Reed et al., "Performance of A d=0 Demond/Remod Detector With Partial Erasure Matching," *Cirrus Logic*, Manuscript received Feb. 4, 1997.

Spalding et al., "SA 19.5: A 200Msample/s 6b Flash ADC in 0.6μm CMOS," *IEEE International Solid–State Circuits Conference*, Feb. 10, 1996.

Spurbeck et al., "Interpolated Timing Recovery for Hard Disk Drive Read Channels," *IEEE*, Aug., 1997.

Tuttle et al., "TP 4.2: A 130Mb/s PRML Read/Write Channel with Digital–Servo Detection," *IEEE International Solid–State Circuits Conference*, Feb. 8, 1996.

Vanderkooy et al., "Resolution Below the Least Significant Bit in Digital Systems with Dither," *J. Audio Eng. Soc.*, 32(3), Mar. 1984.

(List continued on next page.)

*Primary Examiner*—W. Chris Kim
*Attorney, Agent, or Firm*—Richard D. Egan; Dan Shifrin

[57] ABSTRACT

A system and method is provided to improve the jitter performance of high frequency synthesizers used in read/write channel circuits. The frequency synthesizer is implemented with multiple phase locked loops arranged in a cascaded fashion to increase the update rates at which the cascaded loops operate at for a given frequency resolution of the synthesizer. The cascaded or staged phase locked loops may be utilized for generating read, write, and servo clocks for a read/write channel circuit. The cascaded phase locked loops may also be arranged such that one or more stages are shared to generate the read, write or servo clocks.

18 Claims, 5 Drawing Sheets

OTHER PUBLICATIONS

Welland et al., "FA 17.1: A Digital Read/Write Channel with EEPR4 Detection," IEEE International Solid–State Circuits Conference, Feb. 18, 1994.

Welland et al., "Implementation of a Digital Read/Write Channel with EEPR4 Detection," *IEEE Transactions, Magnetics*; 31(2), Mar. 1995.

Welland et al., "Implementation of a Digital Read/Write Channel with EEPR4 Detection,"—Outline: Crystal Semiconductor Corporation and Cirrus Logic; TMRC '94 Session:F2.

Yamasaki et al, SA 19.2: A 1,7 Code EEPR4 Read Channel IC with an Analog Noise Whitened Detector, IEEE International Solid–State Circuits Conference, Feb. 8, 1997.

METHOD TO IMPROVE THE JITTER OF HIGH FREQUENCY PHASE LOCKED LOOPS USED IN READ CHANNELS

BACKGROUND OF INVENTION

1. Field of the Invention

The present invention relates to frequency synthesizer circuits, and more particularly to frequency synthesizer circuits used in data storage systems such as, for example, magnetic disk storage systems.

2. Description of Related Art

In data storage systems data is stored on a storage media such as a CD-ROM, writable CD, DVD or other optical disk, magnetic tape, magnetic hard disk, etc. Typically, when data is read from the storage media, some form of data detection circuitry is utilized to process the signal generated from or written to the storage media. In magnetic data storage systems, digital data serves to modulate the current in the read/write head coil so that a series of corresponding magnetic flux transitions may be written on to the medium. To read this recorded data, the read head passes over the medium and transduces the magnetic transitions into electrical pulses that alternate in polarity. These pulses are decoded by circuitry commonly called read/write channel circuitry to reproduce the digital data.

The storage medium generally contains at least two types of information or data. The first type of data may be called user data (sometimes referred to as just "data") and generally includes the data that an end user is saving or retrieving from the medium. The second type of information on the medium, called servo information or servo data, is used to determine the position of the read/write head on the medium. Servo information is generally embedded or written on the medium as part of the medium manufacturing process. Often, the two types of data stored on the medium are stored in alternating zones. For example, when information is to be obtained from the disk type medium it is generally transferred in alternating modes of operation, a "read operation" (for obtaining user data) and a "servo operation" (for obtaining servo information). When information is being transferred to a disk the mode of operation is generally called a "write operation."

Decoding the electrical pulses generated from a disk into a digital sequence is performed in most conventional designs by using a discrete time sequence detector in a sampled amplitude read channel. Discrete time sequence detectors are preferred to analog peak detect read channels since the discrete time systems can compensate for inter-symbol interference (ISI) and non-linearities in the medium, providing more reliable and robust data detection performance. There are several well known discrete time sequence detection methods for use in a sampled amplitude read/write channel circuit including discrete time pulse detection (DPD), partial response (PR) with Viterbi detection (partial response maximum likelihood (PRML) sequence detection), decision-feedback equalization (DFE), enhanced decision-feedback equalization (EDFE), and fixed-delay tree-search with decision-feedback (FDTS/DF).

The conversion of the continuous electrical pulses from the disk into a discrete sample sequence involves the "sampling" of the input sequence. The samples are generated at a known rate, known as the sampling rate. The sampling rate is at the frequency of the sampling clock, which is usually generated by a frequency synthesizer, which often contains a phase locked loop (PLL) operating at a programmable frequency. As an example, the clock output of a PLL used to generate the sampling clock for a read channel circuit might range from 50 to 250 MHz. The clock generated by the PLL is used to drive the sampling system, which converts the continuous electrical pulse to discrete sequence. In analog systems, the sampling system is usually a sample-and-hold (S/H) stage, whereas in digital systems, the sampling system is an analog-to-digital converter (ADC).

The actual frequency of the PLL is programmed to be the rate at which data is to be written to or read from the disk. In conventional magnetic storage systems, the rate at which the user data is stored on the medium varies depending upon the location of the data on the medium, while the servo rate is fixed for the entire magnetic medium. In read channel systems where the servo data is detected after conversion to a discrete sample sequence, there usually exist at least two PLL's, one operating at a frequency that corresponds to the data rate and the other operating at a frequency that corresponds to the servo rate. The read channel circuitry chooses the appropriate clock to drive the sampling operation depending on whether the servo information or the data information is being read. In addition, a third PLL may be provided to clock in the digital data to be written on to the magnetic medium and to transfer it to the read/write coil. These PLLs are thus utilized to generate the clock signals which drive the various read, servo and write circuits within a read/write channel circuit.

Figure 1:
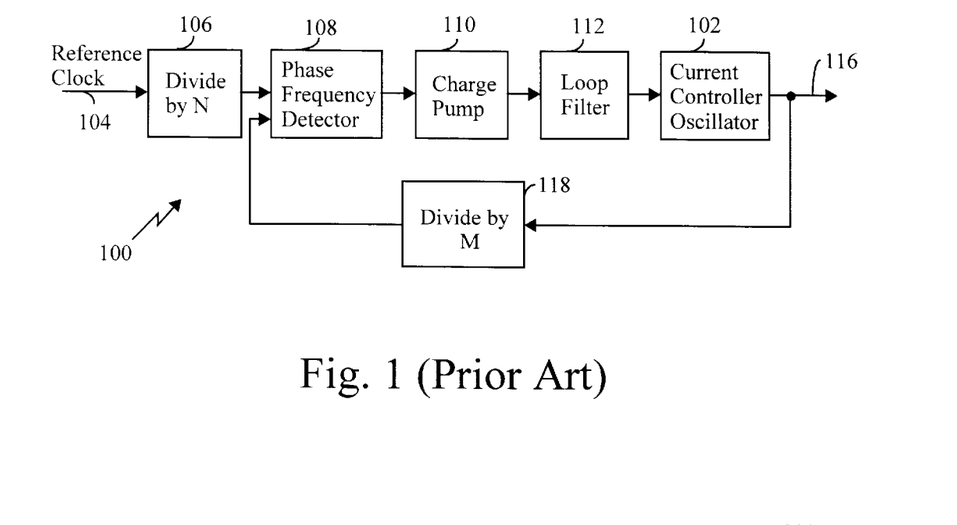
FIG. 1 is a block diagram of a prior art phase locked loop.

FIG. 1 illustrates a typical frequency synthesizer 100 which may be utilized to generate the read, write or servo clock of a read/write channel circuit. As shown in FIG. 1, the frequency synthesizer 100 is a phase lock loop (PLL) which may include a current controlled oscillator 102 and a reference clock input signal 104. The phase locking loop is completed by feeding back the output of the oscillator to a phase/frequency detector which also receives the reference clock signal. More particularly, the reference clock 104 is provided to a divider circuit 106 which divides the reference clock signal by a value of N. The output of the divider 106 is provided as one input to the phase/frequency detector 108. The output of the phase/frequency detector is provided to a charge pump 110 which in turn provides an output to a loop filter 112. The current output of the loop filter 112 is provided to the current controlled oscillator 102. The output 116 of the frequency synthesizer 100 is provided as an output clock and also utilized in a feedback loop which is provided to the divider 118 which divides the output 116 by M. The output of the divider 118 is then provided as the second input to the phase/frequency detector 108. Thus, the PLL receives a reference clock and modulates the control signal of a controlled oscillator until a divided-down version of the oscillator output clock matches in phase with a divided-down version of the reference clock. The loop is considered to be in phase-locked operation when the phases of these divided-down clocks match.

The reference clock is usually a low frequency clock in the range of 10 to 60 MHz generated from a crystal oscillator. The M and N values of the PLL may be called the PLL loop divisors since the output frequency at the PLL output 116 is $F_S$, and is given by $$F_s = (M/N) F_{REF}$$

where $F_{REF}$ is the reference clock frequency. The update rate of the PLL varies with the reference frequency and the divisor N (update rate=$F_{REF} \div N$). The loop control circuits (the phase/frequency detector 108, charge pump 110 and loop filter 112) operate at this update rate.

If M is greater than N, we can see that the output frequency of the clock from the PLL, $F_S$, is greater than the input frequency to the PLL, $F_{REF}$. The generation of a higher output frequency is important in read/write channel applications, where data rates are quite high and also span a wide frequency range, for example from 50 to 250 MHz. Further, it is desirable to generate these frequencies that are much higher than the reference clock frequencies while maintaining low jitter within the output clock signal. Jitter, or phase noise, is the phase error in $F_S$ due to random phase variations around the ideal $F_S$.

In read channel applications, the values of M and N of the PLL may be programmable to be able to achieve a wide range of values for $F_S$. For example, a typical range for the loop divisors M and N may be any quantity from 1 to 255. Because M and N are discrete integer quantities, the PLL does not operate at any arbitrary frequency, but rather is limited to a discrete set of frequencies that are predictable for a known range of M and N values. The step that the synthesizer takes between two neighboring frequencies is known as the resolution of the synthesizer. The resolution of the synthesizer is generally determined by the upper end of the range of possible values for N. As the resolution of the PLL improves, the largest step between any two neighboring frequencies decreases. The resolution percentage of the synthesizer may be defined as the smallest frequency step as a percentage of $F_S$. Thus, a higher resolution results in smaller frequency steps and a lower resolution percentage. In read channel applications, it is common to design PLL's with a frequency resolution of around 0.4% of $F_S$, i.e. the next higher or lower frequency step is only a maximum of 0.4% of $F_S$. For PLL's that need to operate from 50 to 250 MHz while utilizing a reference clock of 40 MHz, this means that the usable values of N might range between 1 and 125, implying a minimum update rate of 40 M/125=320 KHz. Since it is desirable to design the PLL to have a very high frequency resolution so that the data rates can be chosen to maximize the usage of the disk drives, it is desirable for the PLL to be implemented with sufficiently high values of N.

However, for lower update rates (i.e. larger N values), the loop control circuits (the phase/frequency detector 108, charge pump 110 and loop filter 112) will be operating at lower frequencies, thus requiring larger devices in the loop control circuits. This makes the PLL larger and the design more difficult. In addition, for large values of N, the loop control circuits generate corrections to the oscillator less frequently since the corrections occur at the update frequency $F_{up}$. This implies that the oscillator is more likely to have errors in phase which manifests as phase noise, or jitter in the output clock, $F_S$. Therefore to minimize jitter and to thus obtain less error in the read and write operations, it is desirable in read/write channel applications for PLL's to be designed at high update rates (lower N values).

Thus, in typical PLL designs a trade off exists between the desires for good frequency resolution performance and good jitter performance. It would be desirable to utilize a frequency synthesizer for read/write channel circuits which maximizes both frequency resolution and jitter performance.

SUMMARY OF INVENTION

The present invention addresses the problems described above. More particularly, the present invention provides a system and method to improve the jitter performance of high frequency synthesizers used in read/write channel circuits. The frequency synthesizer is implemented with multiple phase locked loops arranged in a cascaded fashion to increase the update rates at which the cascaded loops operate at for a given frequency resolution of the synthesizer. The cascaded or staged phase locked loops may be utilized for generating read, write, and servo clocks for a read/write channel circuit. The cascaded phase locked loops may also be arranged such that one or more stages are shared to generate the read, write or servo clocks. Moreover, the frequency synthesizer may be implemented with standard PLL architecture.

In one embodiment, a data channel circuit for processing data of a data storage medium is provided. The data channel circuit may include at least a first circuit coupled to at least a first clock signal, the first circuit processing data to be read from or written to the data storage medium. Also included in the data channel circuit is a frequency synthesizer that generates the first clock signal. The frequency synthesizer may comprise a first phase locked loop circuit, the first phase locked loop circuit receiving a reference clock signal and having a first phase locked loop output signal, and a second phase locked loop circuit, the second phase locked loop circuit receiving as an input the first phase locked loop output signal and the second phase locked loop providing as an output the first clock signal.

In another embodiment, the present invention may include a frequency synthesizer. The frequency synthesizer may include a first stage phase locked loop circuit having a first output signal, and a second stage phase locked loop circuit having a second output signal, an input of the second stage phase locked loop circuit being the first output signal. The frequency of the first output signal may be equal to or greater than the frequency of the second output signal.

In yet another embodiment, a data storage system is provided. The data storage system may include a data storage medium, a data channel circuit connected to the data storage medium, the data channel circuit including at least one circuit selected from the group comprised of read circuits, write circuits and servo circuits. Further, the data storage system may include a frequency synthesizer within the data channel circuitry, the frequency synthesizer providing at least one clock signal for clocking the at least one circuit. The frequency synthesizer may include at least a first phase locked loop and a second phase locked loop, the output of the first phase locked loop being provided as an input to the second phase locked loop, the at least one clock signal being coupled to the output of the second phase locked loop.

In still another embodiment a method of operating a data channel circuit for processing data of a data storage medium is provided. The method may include processing the data within the data channel circuit with clocked circuitry. Further, the method may include generating at least one clock signal with at least a first stage and a second stage phase locked loop circuit, the phase locked loop circuits being cascaded, the first stage phase locked loop receiving a reference clock signal as an input, the output of the first stage phase locked loop being provided to the input of the second stage phase locked loop, the at least one clock signal coupled to the output of the second stage phase locked loop. Finally the method may include applying the at least one clock signal to the clocked circuitry.

In another embodiment, a method of operating a programmable frequency synthesizer is provided. The method includes cascading in series at least a first and a second phase locked loop, providing a reference clock signal to the input of the first phase locked loop providing the output of the first phase locked loop to the input of the second phase locked loop, and programming the frequency synthesizer by adjusting loop divisors of at least one of the first and second phase locked loops to provide a frequency synthesizer output over a wide frequency range. With this method the jitter performance of the frequency synthesizer is improved for a given frequency resolution by maintaining the frequency of the output of the first phase locked loop at a value approximately greater than or equal to the frequency of an output of the second phase locked loop.

BRIEF DESCRIPTION OF THE DRAWINGS

It is to be noted that the appended drawings illustrate only particular embodiments of the invention and are, therefore, not to be considered limiting of its scope, for the invention may admit to other effective embodiments.

DETAILED DESCRIPTION OF THE INVENTION

Figure 2:
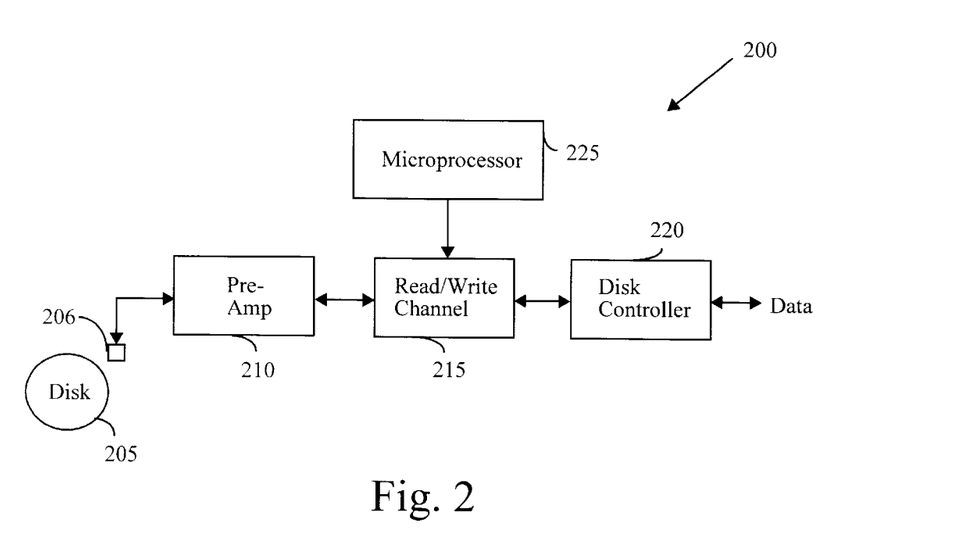
FIG. 2 is a block diagram of a data storage system.

FIG. 2 illustrates a data storage system 200 (for example a disk drive system) in which the present invention may be utilized. The disk drive system may include a disk 205, a read/write head 206, a pre-amp 210, a data detection/write circuit, a microprocessor 225, and a disk controller 220. The data detection/write circuit may be, for example, a read/write channel circuit 215. The disk 205, the read/write head 206, the pre-amp 210, the microprocessor 225, and the disk controller 220 may be implemented individually or in combination through the use of any of a wide variety of commercially available components. For example, the microprocessor may be a general 8-bit microprocessor, the disk controller may be a user's own custom ASIC or a commercially available controller such as the SH7600 available from Cirrus Logic, and the disk 205 and read/write head 206 may be any of a number of hard disks and heads available from hard disk manufacturers.

Data is read and written to the disk 205 by the head 206 which receives and transmits the data through a data path which includes the disk controller 220, the read/write channel circuit 215 and the preamp 210. The data storage system shown in FIG. 2 is just one illustrative example of a data storage system. Other data storage systems may also utilize the present invention. Further, though shown separately, various components of the data storage system may be combined or additional components may be considered to be part of the system including components such as RAM, ROM, power supply circuits, and other circuits. In addition, though shown as separate from a host computer, the data storage system may be integrally formed within a computer or alternatively, the data storage system may be formed as a stand alone unit independent of a host computer. Other data storage systems, for example optical disk drive systems, may also utilize the present invention. Moreover, certain features of the present invention are not limited to the use of data storage systems and may be utilized in many other electronic circuits in which frequency synthesizers are present.

Figure 3:
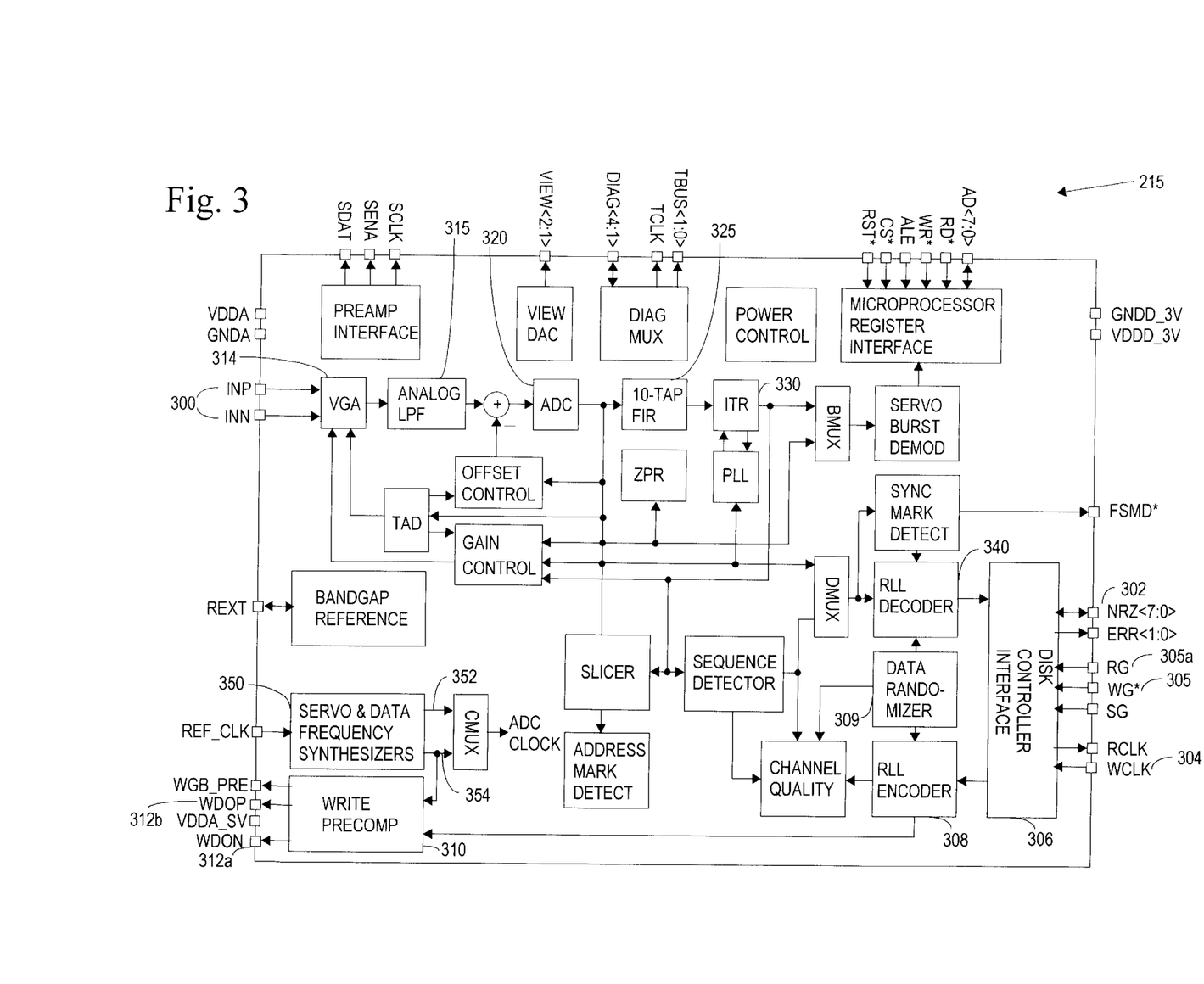
FIG. 3 is a block diagram of a read/write channel circuit.

FIG. 3 is a functional block diagram of the read/write channel circuit 215 of FIG. 2 implemented as a read/write channel. The read/write channel circuit 215 includes circuits for both the write path and the read path. Though a read/write channel circuit 215 is shown in FIGS. 2 and 3, the present invention may also be utilized in a circuit that does not include both read and write circuitry (i.e. a read channel only or write channel only circuit). Thus, as used herein a read/write channel circuit may include circuits that have read only, write only, both read and write functions or additional functions. Moreover, it will be recognized that the read/write channel circuit 215 is just one exemplary circuit which may incorporate the circuits and techniques disclosed herein, and other read/write channel circuits may also utilized the disclosures made herein.

In the write path shown in FIG. 3, data is presented from the disk controller to the read/write channel circuit 215 at data bus pins 302 (NRZ<7:0>). The write mode (i.e. data being presented from the disk controller to the read/write channel circuit for writing on the disk) may be indicated through the use of a write signal on the WG pin 305. The data may be clocked in to the data bus pins 302 according to a write byte clock pin 304. During a write operation, the data may be provided from a disk controller interface 306 to a data randomizer 309 and an RLL (run length limited) encoder 308. The data randomizer 309 may operate to remove periodic patterns that may exist in the data. The RLL encoder 308 operates to encode the data according to the RLL standard. From the RLL encoder 308 the data is provided to the write precompensation circuit 310. The output of the write precompensation circuit may be provided to a preamp through negative and positive write data output pins 312a and 312b (WDON and WDOP pins respectively).

In the read path shown in FIG. 3, data may be presented from the preamplifier 210 at the INP and INN pins 300. The read mode (i.e. when data is being presented from the disk through the pre-amp through the read/write channel circuit to the disk controller) may be indicated through the use of a read signal on the RG pin 305A. Read data may be presented from the read/write channel circuit 215 data bus pins 302 (NRZ<7:0>) to the disk controller. The analog read signal from the pre-amplifier (the signal at the INP and INN input pins 300) is provided to a variable gain amplifier (VGA) 314 to achieve a constant amplitude at the input to an analog low pass filter (LPF) 315. The output of the LPF 315 is provided to the ADC 320 which generates digital samples of the filtered signal. The asynchronous ADC 320 outputs may then be filtered through a digital finite impulse response equalization filter (FIR) 325 and a interpolated timing recovery filter (ITR) 330 to condition the signal to achieve a PR4 target and produce synchronous samples by digital interpolation of the asynchronous sample stream respectively. The ITR 330 output may be provided to a sequence detector 335 and then to the RLL decoder 340. Finally the read operation output may be provided through a disk controller interface 306 to the data bus pins 302.

In FIG. 3, clocks for servo operations, data read operations and data write operations are provided in the frequency synthesizer block 350. The data read and write clocks generally provide a different frequency depending upon the location of the read/write head on the disk. Typically, nominal user data rates (for read and write operations) may vary from 50 to 250 MHz across the various zones of a disk storage medium. Within any given disk zone, the read frequency and the write frequency may be the same. In asynchronously sampled systems, the data may be oversampled during read operations, hence the read frequency may be greater than the write frequency. Servo data is generally fixed at a constant frequency across the whole disk. The fixed servo data rate often is at a single frequency between about 50 and 100 MHz. A reference clock input may be provided to the frequency synthesizer block 350. The reference clock input typically is at a frequency between 10 and 60 MHz.

The data write frequency synthesizer output is provided to the write precompensation circuitry 310 to clock the writing of data to the disk. The data read frequency synthesizer output is provided to the ADC 320 to clock the sampling of data being read from the disk. A wide range of circuits may be utilized for either the write precompensation circuitry 310 or the ADC 320 and the invention herein is not limited to any one implementation of such circuits. Illustrative embodiments of the write precompensation circuitry may be found in U.S. patent application Ser. No. 08/902,832, entitled Read/Write Channel Write Precompensation System and Method, to Jerrell P. Hein, filed Jul. 30, 1997, and illustrative embodiments of the ADC circuitry may be found in U.S. patent application Ser. No. 08/927,122, entitled Method and System For Sliced Integration Of Flash Analog to Digital Converters In Read Channel Circuits, to Marius Goldenberg and Russell Croman, filed Sep. 5, 1997, the disclosures of these patent applications being expressly incorporated herein by reference.

In accordance with the present invention, it has been recognized that the lowest update rate that the PLL operates at can be increased by increasing the frequency of the reference clock, while maintaining the frequency resolution of the PLL output clock. However, the reference clock signal is generally set at a system level by a crystal oscillator not provided within the read/write channel circuit. Using the present invention, however, the effect of increasing the frequency of the reference clock may be obtained by cascading two PLL circuits with the output of the first PLL acting as the reference clock of the second PLL, FIG. 4 illustrates the use of two cascaded PLL circuits, PLL1 and PLL2 (as used herein the 1 and 2 designations refer to the first and second PLL stages respectively).

Figure 4:
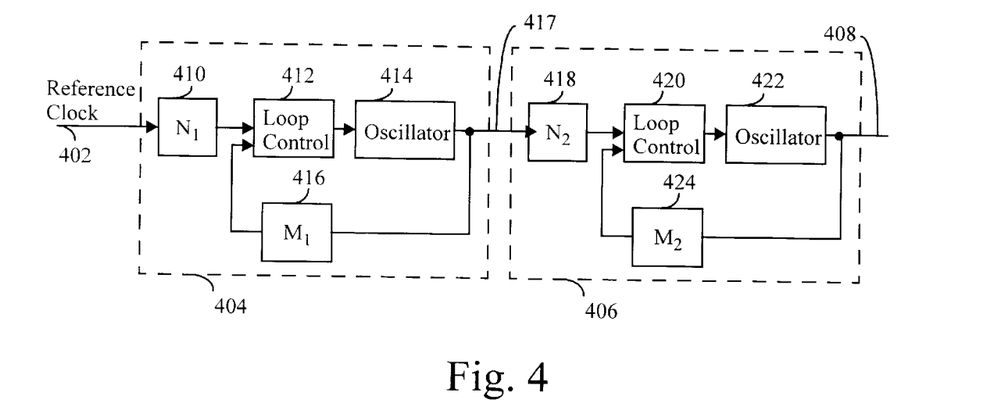
FIG. 4 is a diagram of a frequency synthesizer according to the present invention.

As shown in FIG. 4, a frequency synthesizer 400 receives the reference clock signal 402 which has a frequency of $F_{REF}$. The reference clock signal 402 is provided to the PLL1 404. From this reference clock signal, PLL1 404 generates a high frequency clock at higher frequencies than the reference clock signal 402. The output 417 of PLL1 404 is a clock signal operating at a frequency of $F_{PLL1\ OUT}$. The output 417 of PLL 1 404 is provided as an input to PLL2 406. The high frequency clock output 417 of PLL1 404 now acts as the reference clock input for PLL2 406. The output 408 of PLL2 406 serves as the output of the frequency synthesizer 400 and has a frequency of $F_S$. As shown in FIG. 4, the PLL1 404 may include an N1 divider circuit 410 (having a loop divisor value of N1), loop control circuitry 412 (for example a phase frequency detector, charge pump, and loop filter such as shown in FIG. 1 or other PLL circuits), a controllable oscillator 414 and an M1 divider circuit 416 (having a loop divisor value of M1). Likewise, the PLL2 406 may include an N2 divider circuit 418 (having a loop divisor value of N2), loop control circuitry 420 (for example a phase frequency detector, charge pump, and loop filter such as shown in FIG. 1 or other PLL circuitry), a controllable oscillator 422 and an M1 divider circuit 424 (having a loop divisor value of M2).

In operation, the loop control circuitry 412 of PLL1 404 operates at the update rate of the PLL1 404 which is $F_{REF}\div N1$. Because the output 417 of the PLL1 404 is at higher frequency ($F_{PLL1\ OUT}$) than the reference clock 402, the loop control circuitry 420 of PLL2 406 may now operate at an update rate much higher than the update rate than a system comprised of only one PLL.

The output of PLL1, which is used as a reference clock for PLL2, may be higher, lower, or equal to the maximum frequency output of PLL2. In order to improve the synthesizer resolution while also decreasing the phase noise, in one embodiment the output of the first PLL stage (PLL1) is set at a constant frequency equal to or greater than the highest value of the output range of the second PLL stage (PLL2). By utilizing such a configuration, high N values may be utilized within the second PLL stage while still resulting in a high update rate (thus resulting in high resolution with low jitter or phase noise).

The advantages of using cascaded or staged PLLs may be seen with reference to a system in which a 40 MHz reference clock is provided and the desired frequency synthesizer output range is 50–250 MHz. As described above, for a prior art system to provide such an output with a frequency resolution 0.4%, a typical minimum update rate will be approximately 320 KHz. Thus, a typical prior art PLL may have an update rate from 320 KHz to 40 MHz. However by utilizing the cascaded or staged PLL technique described herein, such resolution may be obtained with a minimum update rate from approximately 10 to 40 MHz for the PLL1 and approximately 1 MHz for the PLL2. Because both PLL1 and PLL2 are operating at significantly higher update rates than the prior techniques, the jitter performance at the output of the cascaded structure is greatly improved as compared to a non-cascaded structure.

An example embodiment of the cascaded PLL frequency synthesizer may be implemented with a 40 MHz reference clock to obtain an output range of 50–250 MHz. In this embodiment, the reference clock may be converted to a 250 MHz PLL1 output clock. Example loop divisors for the PLL1 may be N1=4 and M1=25. Thus, the update rate for the PLL1 is 10 MHz. To obtain a frequency resolution of 0.4% at the output of PLL2, the allowed values of N2 range between 1 and 250. Thus the minimum update rate that PLL2 operates at is 250 M/250=1 MHz. Thus, the embodiment described above may have a PLL2 update rate ranging from 1 MHz to 250 MHz, a significant improvement over a single PLL system.

In one embodiment, it may be preferred to set the output of PLL1 to be higher than the maximum required output frequency of PLL2 rather than merely equal to the maximum output frequency of PLL2. Such a design reduces the possibility of any cross-talk and coupling between PLL1 and PLL2 which may occur when the two PLLs operate at frequencies very close to each other. Such performance improvements may typically be obtained by setting the output of PLL1 at a frequency that is about 5% or more higher than the maximum required frequency output of PLL2.

An analysis of this cascaded PLL system suggests that the worst-case jitter present in the output clock of PLL2 is dominated by the update rate that PLL2 operates at. This is true for systems where PLL1 is operating at update rates of 10–40 MHz and PLL2 is operating at update rates in the range of 1–250 MHz because the minimum update rate of PLL2 is less than the minimum update rate of PLL1.

The cascaded or staged PLL frequency synthesizer architecture described above may be implemented in a read/write channel circuit in many fashions. For example, the cascaded or staged PLL frequency synthesizer architecture may be utilized to generate a clock signal for clocking the read circuitry, write circuitry, and/or servo circuitry. In a most basic embodiment, one frequency synthesizer such as the frequency synthesizer 400 of FIG. 4 may be provided for each of the read, write and servo circuitry so that three frequency synthesizers, each having two cascaded PLLs, may be utilized. However, it has been recognized that the first stage (PLL1) of circuitry used to generate the read, write and/or servo clocks may be consolidated to conserve circuit area. Thus, frequency synthesizers such as shown in FIGS. 5–8 may be utilized to generate the clock signals for a read/write channel circuit such as shown in FIG. 3.

Figure 5:
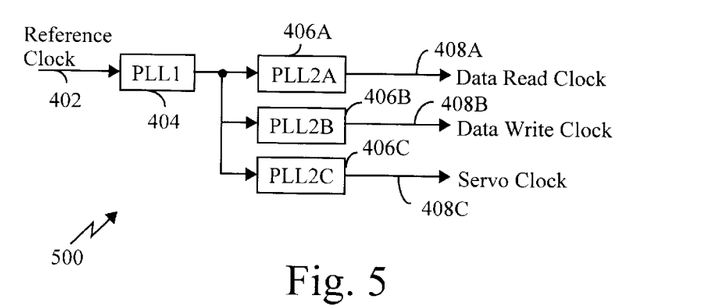
FIG. 5 is a diagram of a frequency synthesizer according to the present invention for use in a read/write channel circuit.

As shown in FIG. 5, a frequency synthesizer 500 is provided for generating a data read clock signal 408A for clocking read circuitry, a data write clock signal 408B for clocking write circuitry, and a servo clock signal 408C for clocking servo circuitry. The frequency synthesizer 500 includes one first stage PLL1 404 and three second stage PLLs-PLL2A 406A, PLL2B 406B, and PLL2C 406C which each receive the output of the first stage PLL1 404 for use as an input clock signal. Thus, as shown in FIG. 5, a shared first stage PLL1 is utilized to generate multiple clock signals while each separate clock signal is provided from an output of a separate second stage PLL2. Thus, for example, a reference clock 402 may operate at 40 MHz, the output frequency of PLL1 404 may be 250 MHz, and each second stage may have the necessary loop divisors to obtain the desired clock frequencies for the read, write and servo circuits. Typical frequencies for the write and read clocks may be in the same 50–250 MHz range (if oversampling is utilized for the read circuitry the read clock frequency may be slightly higher than the write clock frequencies) and a typical frequency output for the servo clock may be 50–100 MHz.

Figure 6:
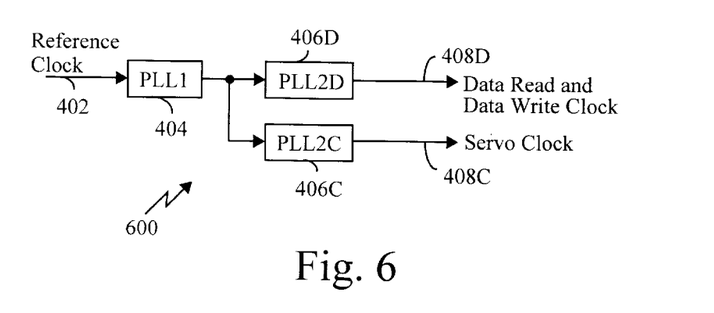
FIG. 6 is a diagram of another frequency synthesizer according to the present invention for use in a read/write channel circuit.

FIG. 6 illustrates a frequency synthesizer 600 staged similar to the frequency synthesizer of FIG. 5 except the read and write clocks may be generated from a one PLL circuit, PLL2D 406D rather than being generated from separate PLL circuits as in FIG. 5. Because the frequency range of the read and write clocks are generally similar (and may be identical) and the clock signals are generally not being utilized at the same time, a frequency synthesizer configuration such as shown in FIG. 6 may be utilized to conserve circuit area. Thus, the frequency synthesizer 600 includes one shared first stage PLL1 404 and two second stage PLLs, PLL2C 406C and PLL2D 406D.

Figure 7:
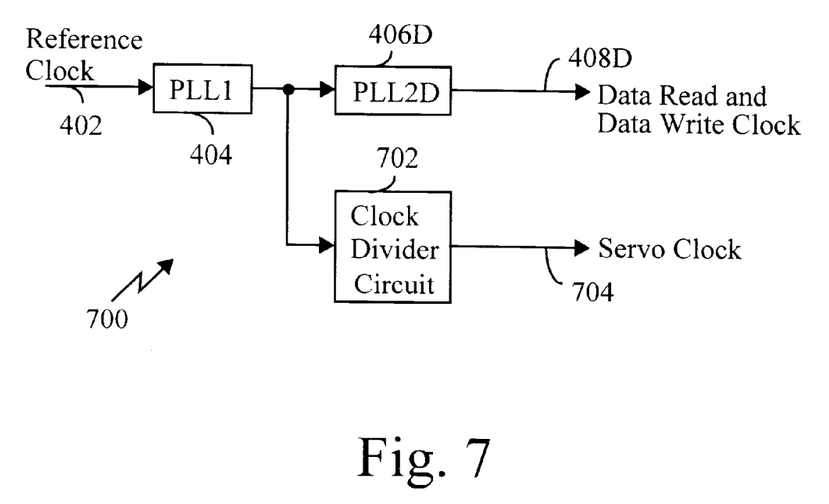
FIG. 7 is a diagram of another frequency synthesizer according to the present invention for use in a read/write channel circuit.

As described above, the servo clock frequency is usually fixed over the entire storage medium. Thus, it is possible to operate the first stage PLL (PLL1) at a frequency which is a multiple of the servo frequency and to directly derive the servo clock from the output of the first PLL stage. FIG. 7 shows such an implementation where the servo clock signal 704 is directly derived from the output of the first stage PLL1 404 by simply dividing the output of PLL 1 404 with a clock divider circuit 702 which utilizes an appropriate divisor. The output of the first stage PLL1 404 serves as the reference clock for the second stage PLL2D 406D which generates the data read and data write clock signal 408D for the read and write channel circuitry. It will be recognized that in place of the PLL2D 406D of FIG. 7, separate read and write PLLs may be utilized such as PLL2A 406A and PLL2B 408B as shown in FIG. 5.

Figure 8:
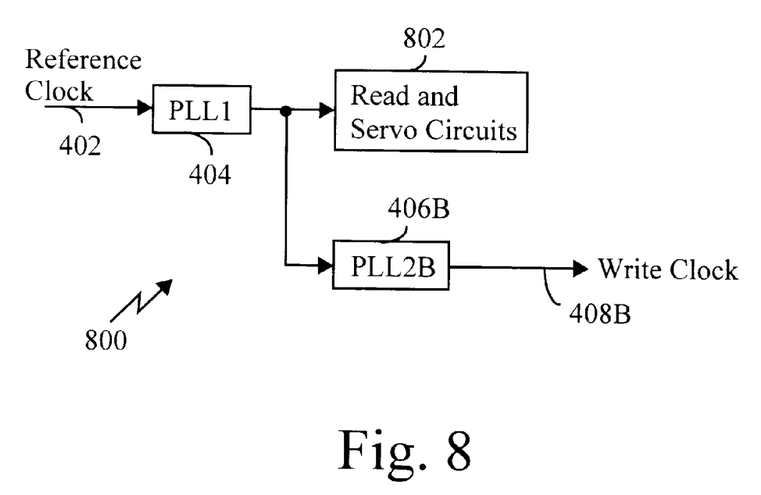
FIG. 8 is a diagram of another frequency synthesizer according to the present invention for use in a read/write channel circuit.

FIG. 8 demonstrates yet another potential frequency synthesizer configuration utilizing the present invention. The configuration of FIG. 8 may be utilized in read/write channel circuits in which a constant data read clock frequency is utilized. In such read/write channel circuits, a read and servo clock is utilized which has a fixed frequency at a frequency higher than the maximum required data and servo frequencies. Servo and data read information is then obtained by performing a variable rate decimation operation following the sampling operation (wherein the sampling is typically performed by an analog to digital converter) to create a sampled pattern at the output of the analog to digital converter that resembles the pattern that would have been obtained if the sampling were performed at the Nyquist sampling frequency. Such a technique is described in U.S. patent application Ser. No. 08/567,682 entitled "Fixed Sample Rate Sample Amplitude Read Channel For Zoned Magnetic Recording" by Behrens et al., the disclosure of which is expressly incorporated herein by reference. Thus, as shown in FIG. 8 a frequency synthesizer 800 may be configured such that the output of the first-stage PLL1 404 is used to clock the sampling operation of the sampler (such as an ADC) utilized in the read and/or servo circuitry 802. The second stage PLL2B 406B still uses the output of the first stage PLL1 404 as a reference clock to generate a clock that is programmed to the data write rate to transfer digital data to the storage medium.

Figure 9:
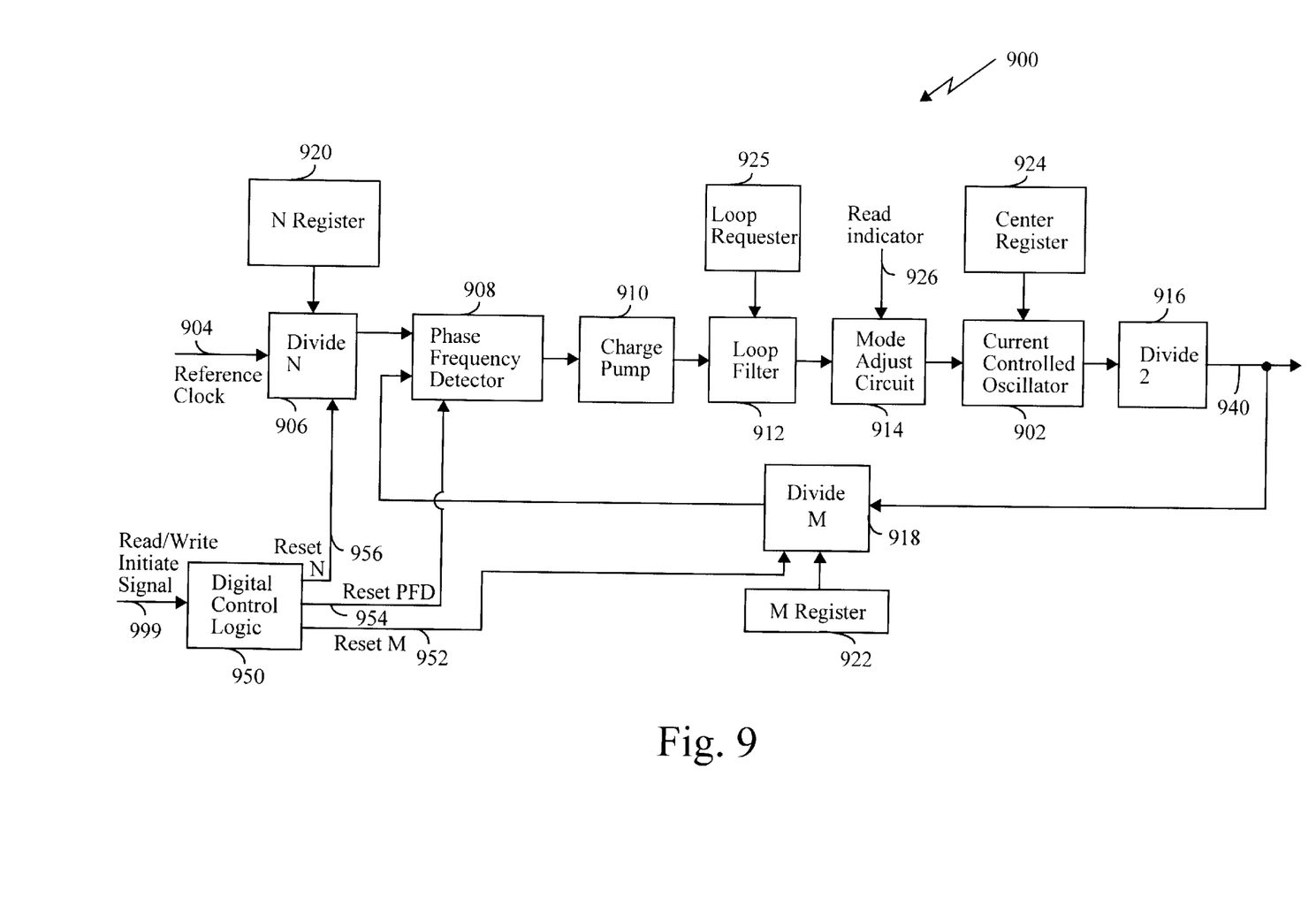
FIG. 9 is a block diagram of a phase locked loop for use in the frequency synthesizers of FIGS. 6 and 7.

The present invention may be utilized with a wide variety of types of PLL circuits. FIG. 9 illustrates a PLL 900 which may be utilized in the variety of frequency synthesizer configurations of the present invention. As shown in FIG. 9, the PLL 900 is provided as an exemplary PLL for use as a data read and data write PLL such as PLL2D 406D of FIG. 6. It will be recognized that the type of PLL shown as PLL 900 may be also utilized for the other PLL circuits disclosed herein. The PLL 900 may include a current controlled oscillator 902 and a clock input signal 904. The phase locking loop is completed by feeding back the output of the oscillator to a phase/frequency detector which also receives the input clock signal. More particularly, the input clock 904 is provided to a divider circuit 906 which divides the reference clock signal by a value of N. The output of the divider 906 is provided as one input to the phase/frequency detector 908. The output of the phase/frequency detector is provided to a charge pump 910 which in turn provides an output to a loop filter 912. The current output of the loop filter 912 is provided to a mode adjust or settling circuit 914. The mode adjustment circuit 914 has an output which is provided to the current controlled oscillator 902. The output of the current controlled oscillator 902 may be provided to a divider circuit 916 which divides the oscillator output by two. The divide by two circuit may be optionally utilized in order to obtain a more uniform duty cycle in the output 940 signal. The output 940 of the PLL 900 is provided as an output clock and also utilized in a feedback loop which is provided to the divider 918 which divides the output 940 by M. The output of the divider 918 is then provided as the second input to the phase/frequency detector 908.

Three registers 920, 922, and 924 are provided to control the frequency at the output 916 of the PLL. The center register 924 sets the center operating frequency of the current controlled oscillator. Because the frequency synthesizer may operate over a wide frequency across the zones of a disk (for example 50 to 250MHz), the operating range of the oscillator may be divided into multiple ranges. Each range may then have a corresponding nominal center operating frequency as provided by the center register. For example, a 50 to 250 MHz range may be divided into 8 frequency ranges and a center operating frequency value may be provided for each range by the center register 924. For any given range, the nominal center frequency provides sufficient operating room for both the read and write frequencies to be accommodated within the range so that the center register value is the same for a read and write operation within a given disk zone.

The M register 922 is a programmable register which sets the divisor of the divider 918 and the N register 920 is a programmable register which sets the divisor of the divider 906. The M and N values may be called the PLL loop divisors since the output frequency at the PLL output 416 is $F_S$, and is given by $$F_s = (M/N) F_{REF}$$

where $F_{REF}$ is the reference clock frequency which typically may be provided from a crystal oscillator which may have a frequency of between 20 and 60 MHz. The loop register 925 provides a programmable register through which to adjust the operating range of the loop filter 912. The operating range of the loop filter 912 should be adjusted to match the update rate of the phase/frequency detector 908 because the update rate varies with the reference frequency and the divisor N (update rate=$F_{REF} \div N$). Thus, the loop register 925 may be programmed with different values for read operations and write operations.

Though each M, N, and loop register (registers 920, 922, and 925 respectively) are shown as one register each, it will be recognized that each register may be composed of two registers, one for storing values for read operations and one for storing values for write operations for any given disk zone. Thus, when changing modes of operation the read and write registers for each value may be multiplexed to the corresponded circuit (the divide by M, divide by N, or loop filter circuits). For example, a read M register provides the M value to the M divider 918 during read operations and a write M register provides the M value to the M divider 918 during write operations.

The divider circuits 906, 916, and 918, the phase/frequency detector 908, the charge pump 910, the loop filter 912, and the controlled oscillator 902 may be any of a wide variety of standard circuits. For example, the M and N dividers 918 and 906 may be programmable digital counters that provide an output clock whose frequency is the input clock frequency divided by M or N respectively. The counter counts M or N pulses of the input clock and outputs a single pulse at the output. The phase/frequency detector 908 compares the outputs of the divide by M circuit 918 and the divide by N circuit 906 to provide an output that is proportional to the phase and frequency error between the two inputs to the detector. When the PLL is settled, the outputs of the divide by M circuit 918 and the divide by N circuit 906 have the same frequency and the same phase (i.e., the edges of the two clocks are in line with each other). When the two signals are not in phase, the phase/frequency detector 908 provides an UP or DOWN signal to the charge pump 910 to enable the oscillator to speed up or slow down. The charge pump 910 receives the digital UP or DOWN signals from the phase/frequency detector 908 and converts the signals into a current that serves to modulate voltages up or down in the loop filter 912.

Typically, the current from the charge pump either charges or discharges a resistor-capacitor network in the loop filter 912. When the PLL is settled, the voltages in the resistor-capacitor network do not change since the output of phase/frequency detector is zero and the charge pump does not provide any output current. Some of the loop filter capacitors may be switchable and switched in to the circuit to receive current from the charge pump depending on the value in the loop register 925, which depends on the PLL update rate. By changing the effective capacitor value of the loop filter, the PLL is kept stable over the entire range of update rate settings. The output of the loop filter is a current that controls the current controlled oscillator 902. The current controlled oscillator 902 has an output frequency that is a function of its input current. Since the PLL may have a wide range of operating frequencies, capacitors in the oscillator may be switched in to slow down the oscillator to center the oscillator to a given frequency range for the same control current range.

When the data synthesizer is switched from a read to write frequency, the values of M and N are changed to obtain the appropriate frequency change. In order to improve system stability, it may be desirable to reset and hold the M and N dividers while the M and N values are being changed. Further, because of the high switching speeds needed for many data storage systems, the mode adjustment (or settling) circuit 914 may be utilized when switching from a read operation to a write operation or vice versa. More particularly, the mode adjustment (or settling) circuit 914 receives a read indicator signal 926 which indicates when a read operation is desired as opposed to a write operation. The circuit 914 increases the speed at which the data synthesizer output settles to the desired write or read frequency by adjusting the current supplied to the current controlled oscillator when the mode of operation is switched. Digital control logic 950 also receives the read/write initiate signal 999 in order to produce a reset M signal 952 for the divider 918, a reset N signal 956 for the divider 906, and a reset PFD signal 954 for the phase/frequency detector 908.

In one embodiment, when the data synthesizer is operating in a write mode and is switching to a read mode at a higher data frequency (for example 4.93% higher), the mode adjustment (or settling) circuit 914 adds additional current to the current supplied from the loop filter 912 so that the current supplied to the current controlled oscillator 902 is higher and thus the data synthesizer reaches the desired new frequency (the read frequency) quicker. Similarly, when the data frequency synthesizer is switched from a higher frequency (the read frequency) to a lower frequency (the write frequency) the mode adjustment (or settling) circuit 914 reacts by ceasing the addition of extra current to the current control oscillator. In this manner, the data synthesizer output also settles at the new desired lower frequency quicker. The PLL 900 shown herein is just one type of PLL which is particularly useful for a PLL such as PLL2D 406D. Such a PLL is disclosed in U.S. patent application Ser. No. 08/924,190, entitled "Method And System To Improve Synthesizer Settling Times For Small Frequency Steps In Read Channel Circuits", to G. Diwakar Vishakhadatta and Jerrell P. Hein, filed Sep. 5, 1997, the disclosure of which is expressly incorporated herein by reference. Such a PLL is of particular use due to the small settling time achieved when switching the PLL between read and write modes.

The benefits of the present invention may be obtained through a wide variety of other possible implementations of the cascaded or staged PLL frequency synthesizer structure in addition to those embodiments shown herein. For example, though shown herein with respect to two cascaded PLLs, more than two stages may be utilized. Further, the techniques for generating separate data, write, or servo clocks with at least some shared PLLs may be modified while still utilizing cascaded or staged PLLs. In addition, the cascaded techniques of the present invention may be utilized for generating some of the read, write or servo clocks while one or more of those clocks may be generated with non-cascaded techniques. Moreover, any of a wide range of PLL structures may be utilized in a cascaded or staged manner and the specific PLL structures shown herein are provided as illustrative embodiments. For example, the loop control circuitry shown herein may be implemented in any of a wide variety of manners.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as presently preferred embodiments. Equivalent elements may be substituted for those illustrated and described herein, and certain features of the invention may be utilized independently of the use of other features, all as would be apparent to one skilled in the art after having the benefit of this description of the invention.

What is claimed is:

1. A data channel circuit for processing data of a data storage medium, comprising:
    at least a first circuit coupled to at least a first clock signal, the first circuit processing data to be read from or written to the data storage medium;
    at least a second circuit coupled to at least a second clock signal, the second circuit processing data to be read from or written to the data storage medium; and
    a frequency synthesizer generating the first clock signal and the second clock signal, the frequency synthesizer comprising,
        a first phase locked loop circuit, the first phase locked loop circuit receiving a reference clock signal and having a first phase locked loop output signal,
        a second phase locked loop circuit, the second phase locked loop circuit receiving as an input the first phase locked loop output signal and the second phase locked loop providing as an output the first clock signal; and
        a third phase locked loop circuit, the third phase locked loop circuit receiving as an input the first phase locked loop output signal and providing as an output the second clock signal,
    wherein the first clock signal is at least one of a read clock signal, a write clock signal or a servo clock signal, and the second clock is at least one of a read clock signal, a write clock signal or a servo clock signal, and wherein both the read clock signal and the write clock are provided from either the second or third phase locked loop circuits.

2. The data channel circuit of claim 1, frequency synthesizer being programmable to provide the first clock signal with a frequency range of at least approximately 100 MHz with a frequency resolution of approximately 0.4% or less.

3. The data channel circuit of claim 2, the frequency of the first phase locked loop output signal being approximately equal to or greater than the frequency of the first clock signal.

4. The data channel circuit of claim 1, the first clock signal being a read and write clock signal and the second clock being a servo clock signal.

5. The data channel circuit of claim 1, wherein the second circuit processes data to be read from or written to the data storage medium.

6. The data channel circuit of claim 1, the frequency of the first phase locked loop output signal being approximately equal to or greater than the frequency of the first clock signal.

7. The data channel circuit of claim 6, the frequency of the first clock signal being programmable.

8. A data channel circuit having a frequency synthesizer, comprising:
    a first stage phase locked loop circuit having a first output signal; and
    a plurality of second stage phase locked loop circuits, each of the second stage phase locked loop circuits having separate second output signals, an input of each second stage phase locked loop circuit being the first output signal, the second output signals including at least a write clock signal and a read clock signal,
the frequency of the first output signal being equal to or greater than the frequency of at least one of the second output signals.

9. The data channel circuit of claim 8, the frequency of the second output signal being programmable.

10. The data channel circuit of claim 8, the frequency synthesizer being programmable to provide the second output signal with a frequency range of at least approximately 100 MHz with a frequency resolution of approximately 0.4% or less.

11. A method of operating a data channel circuit for processing data of a data storage medium, comprising:
    processing the data within the data channel circuit with clocked circuitry;
    generating at least one clock signal with at least a first stage and a second stage phase locked loop circuit, the phase locked loop circuits being cascaded, the first stage phase locked loop circuit receiving a reference clock signal as an input, the output of the first stage phase locked loop circuit being provided to the input of the second stage phase locked loop circuit, the at least one clock signal coupled to the output of the second stage phase locked loop circuit; and
    cascading a plurality of second stage phase locked loop circuit with the first stage phase locked loop circuits, the outputs of the plurality of second stage phase locked loop circuits providing separate clock signals for clocking read and write circuitry.

12. The method of claim 11, the output of the first stage phase locked loop being at a frequency greater than the reference clock signal and the output of at least one of the second stage phase locked loops being at a frequency less than or equal to the frequency of the first phase locked loop.

13. The method of claim 12, further comprising programming at least one of the phase locked loop circuits by adjusting phase locked loop divisors.

14. A data storage system comprising:
    a data storage medium;
    at least two data channel circuits connected to the data storage medium, the data channel circuits including at least two circuits selected from the group comprised of read circuits, write circuits and servo circuits; and
    a frequency synthesizer within the data channel circuitry, the frequency synthesizer providing at least two clock signals for clocking the at least two data channel circuits, the frequency synthesizer comprising, at least a first phase locked loop, a second phase locked loop, and a third phase locked loop, the output of the first phase locked loop being provided as an input to the second phase locked loop and as an input to the third phase locked loop, one of the at least two clock signals being coupled to the output of the second phase locked loop and another of the at least two clock signals being coupled to the output of the third phase locked loop, the two clock signals providing at least a write and read clock signal.

15. The data storage system of claim 14, the frequency of the output of the first phase locked loop being approximately equal to or greater than the frequency of the at least one clock signal.

16. The data channel circuit of claim 15, the frequency of the output of the first phase locked loop and the frequency of the at least one clock signal being programmable.

17. A method of operating a programmable frequency synthesizer within a data channel circuit, comprising:

cascading in series at least a first and a second phase locked loop;

providing a reference clock signal to the input of the first phase locked loop;

providing the output of the first phase locked loop to the input of the second phase locked loop;

providing the output of the first phase locked loop to the input of a third phase locked loop, read and write clocks being provided from one or both of the second or third phase locked loops;

programming the frequency synthesizer by adjusting loop divisors of at least one of the first and second phase locked loops to provide a frequency synthesizer output over a wide frequency range;

improving the jitter performance of the frequency synthesizer for a given frequency resolution by maintaining the frequency of the output of the first phase locked loop at a value approximately greater than or equal to the frequency of an output of the second phase locked loop; and programming the output of the second phase locked loop and the output of the third phase locked loops to provide different clock frequencies.

18. The method of claim 17, further comprising:

coupling the output of the second phase locked loop to at least one clocked circuit of a data channel circuit.

* * * * *